United States Patent [19]
Otsuki

[11] Patent Number: 5,422,301
[45] Date of Patent: Jun. 6, 1995

[54] METHOD OF MANUFACTURING SEMICONDUCTOR DEVICE WITH MOSFET

[75] Inventor: Yoshimichi Otsuki, Kawasaki, Japan

[73] Assignee: Fujitsu Limited, Kasasaki, Japan

[21] Appl. No.: 321,900

[22] Filed: Oct. 17, 1994

[30] Foreign Application Priority Data

Dec. 28, 1993 [JP] Japan .................. 5-337537

[51] Int. Cl.⁶ ............................................. H01L 21/76
[52] U.S. Cl. .......................................... 437/70; 437/26; 437/27; 437/28; 437/45; 437/968; 437/56
[58] Field of Search ............... 437/26, 27, 28, 70, 437/45, 968

[56] References Cited

U.S. PATENT DOCUMENTS

| | | | |
|---|---|---|---|
| 4,422,885 | 12/1983 | Brower et al. | 437/45 |
| 4,574,467 | 3/1986 | Halfacre et al. | 437/28 |
| 4,717,683 | 1/1988 | Parrillo et al. | 437/27 |
| 5,348,910 | 9/1994 | Namose | 437/70 |
| 5,358,890 | 10/1994 | Sivan et al. | 437/69 |

FOREIGN PATENT DOCUMENTS 0089463  4/1989  Japan ................. 437/27

OTHER PUBLICATIONS

F. S. Lai et al., A Highly Latchup-Immune 1 μm CMOS Technology Fabricated with 1 MeV Ion Implantation and Self-Aligned TiSi₂; IEEE; IEDM 85; pp. 513-516, May 1985.

Primary Examiner—Brian E. Hearn
Assistant Examiner—Trung Dang
Attorney, Agent, or Firm—Armstrong, Westerman, Hattori, McLeland & Naughton

[57] ABSTRACT

A method of manufacturing a semiconductor device with MOSFETs including the steps of forming an anti-oxidation film pattern over an element forming region of a semiconductor substrate, selectively oxidizing a region not covered with the anti-oxidation film pattern on the semiconductor substrate to form an isolating oxide film, and implanting impurities into the semiconductor substrate via the isolating oxide film and anti-oxidation film at a predetermined acceleration energy to form a threshold voltage control region under the anti-oxidation film and a channel stop region under the isolating oxide film. The channel stop region and threshold voltage control region can be formed by a single ion implantation process.

14 Claims, 7 Drawing Sheets

METHOD OF MANUFACTURING SEMICONDUCTOR DEVICE WITH MOSFET

BACKGROUND OF THE INVENTION

1. Field of the Invention

The present invention relates to a method of manufacturing a semiconductor device, particularly a semiconductor device with MOSFETs.

2. Description of the Related Art

A MOSFET is manufactured generally by forming a gate electrode on a gate oxide film over a semiconductor region of one conductivity type and forming drain and source regions of another conductivity type opposite to the one conductivity type in the semiconductor region on opposite sides of the gate electrode.

A gate voltage (threshold voltage) necessary for inverting the conductivity type of the semiconductor region (channel region) under the gate electrode depends on the impurity concentration of the channel region. In order to obtain a suitable threshold voltage without increasing the impurity concentration of the whole semiconductor region, channel doping is performed by which impurities are doped in the surface region defining the channel region.

Electrical isolation between semiconductor elements is generally achieved by forming a thick field oxide film. However, if the concentration of impurities, particularly p-type impurities, is low, the surface of the p-type semiconductor region contacting the thick field oxide film may be inverted into an n-type by positive charges in the oxide film, resulting in an undesired channel. In order to avoid the formation of such a channel, a channel stop region having an increased impurity concentration is formed under the oxide film.

In a CMOS integrated circuit, n-type regions are formed in a p-type well, and p-type regions are formed in an n-type well. A pnpn structure is formed along the interface between the p- and n-type wells, resulting in a danger of latch-up. A retrograde well structure is known as an effective well structure for preventing latch-up.

A retrograde well has an impurity concentration distribution which shows a higher impurity concentration at the region more remote from the surface of the semiconductor substrate. Such an impurity concentration distribution is effective for lowering the effects of parasitic elements.

A retrograde well is generally formed by the following processes. First, after electrically isolating semiconductor element regions by LOCOS oxidation, impurities for forming a well are implanted at a high energy by using a resist mask thicker than an ordinary mask as an ion implantation mask. Next, by using the same mask, impurities for forming a channel stop region and a threshold voltage control region are implanted.

Impurities implanted at a high energy has a distribution peak at some depth from the semiconductor substrate surface. Therefore, the impurity concentration lowers towards the surface from the peak position.

Impurities for channel stop are required to be implanted under the thick field oxide film used for element isolation. Channel stop impurities are therefore implanted at a relatively high energy, and impurities are implanted also into the element forming region at a relatively deep position. The impurity concentration at the surface region lowers, being difficult to realize a desired threshold value. In order to obtain optimum impurity concentrations both at the channel stop region and at the threshold voltage control region, it becomes necessary to implant impurity ions at a different acceleration energy.

Figure 5A:
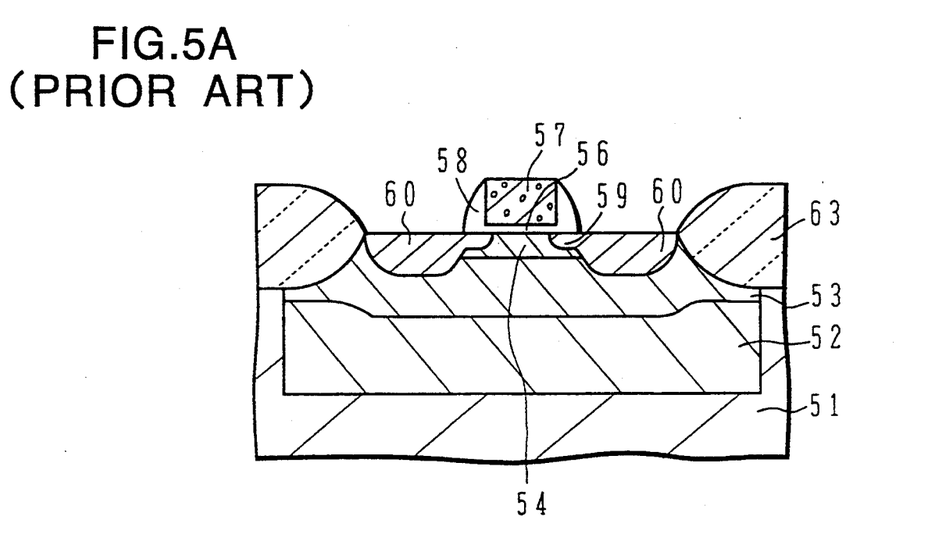
FIGS. 5A to 5C are a cross sectional view of a semiconductor substrate illustrating a conventional method of forming a semiconductor device, and graphs showing impurity concentration distributions in the semiconductor substrate.
Figure 5B:
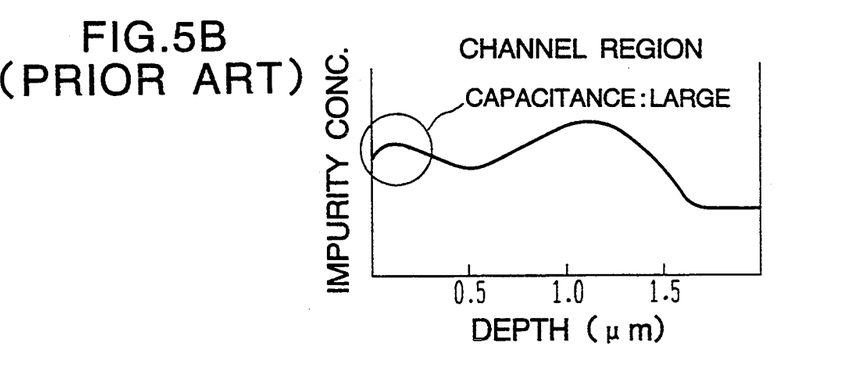
Figure 5C:
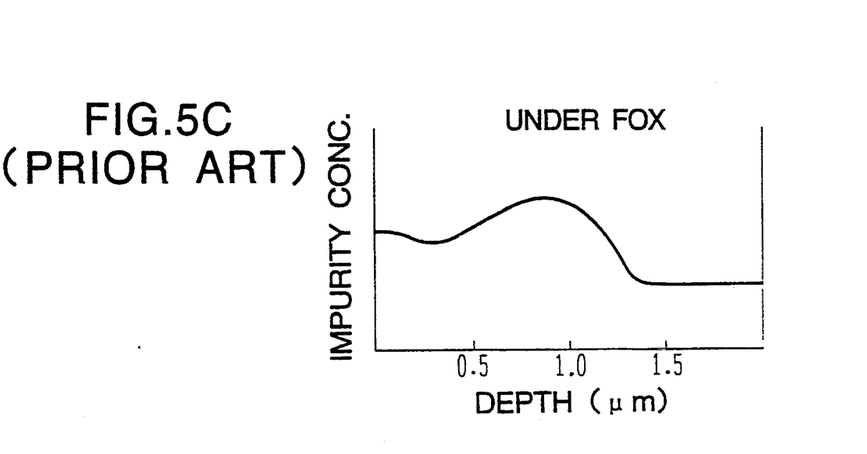

FIGS. 5A to 5C are schematic diagrams explaining the structure of a conventional MOSFET in a CMOS integration circuit.

Referring to FIG. 5A, a thick field oxide film 63 is being formed on the surface of an n-type Si substrate 51. The field oxide film 63 surrounds an element forming region in which a deep p-type well 52 is formed. The p-type well 52 is a retrograde well.

A p-type channel stop region 53 of a high impurity concentration is being formed submerging under the field oxide film 63. Since the channel stop region 53 is formed by using the same mask as used for forming the retrograde well 52, the lateral shape of the channel stop region is the same as the retrograde well 52.

By using the same mask, a threshold voltage control region 54 is formed at a shallower position. The p-type well 52, channel stop region 53, and threshold voltage control region 54 are formed by implanting ions at different acceleration voltages.

For example, the well region 52 is formed by implanting boron at an acceleration voltage of 400 keV and at a dose of $4 \times 10^{13}$ cm$^{-2}$, the channel stop region 53 is formed by implanting boron at an acceleration voltage of 80 keV and at a dose of $2 \times 10^{12}$ cm$^{-2}$, and the threshold voltage control region 54 is formed by implanting boron at an acceleration voltage of 30 keV and at a dose of $4 \times 10^{12}$ cm$^{-2}$. The thickness of the field oxide film 63 is 250 nm for example.

A polycrystalline Si gate electrode 57 is formed over the channel region, with a gate oxide film 56 being interposed therebetween. A lightly doped n-type region 59 constituting an LDD (lightly doped drain) structure is formed through ion implantation.

Thereafter, a side wall oxide region 58 is formed on the side walls of the gate electrode 58 by deposition of an oxide film followed by reactive ion etching (RIE), and then n-type impurity ions are implanted to form source/drain regions 60.

FIGS. 5B and 5C show impurity concentration distributions obtained by implanting ions three times for forming the well region 52, channel stop region 53, and threshold voltage control region 54. FIG. 5B shows the impurity concentration distribution at the channel region.

At the channel region, ion implantation is performed three times. As a result, the region having a high impurity concentration is formed in some wide depth region near the surface of the retrograde well 52.

The source/drain regions 60 at the element forming region are formed in this region having a relatively high impurity concentration as shown in FIG. 5B. As a result, a parasitic capacitance at the source/drain regions becomes large.

FIG. 5C shows the impurity concentration distribution under the field oxide film 63. It is necessary to form the channel stop region 53 having a high impurity concentration just under the field oxide film 63. The channel stop region 53 is formed by implanting ions at an acceleration energy sufficient for allowing ions to pass through the field oxide film 63 and at a dose sufficient for providing a necessary impurity concentration.

Implanted impurity ions are decelerated by the field oxide film 63. Therefore, a valley of the impurity concentration distribution is formed at a position shallower than that shown in FIG. 5B.

SUMMARY OF THE INVENTION

It is an object of the present invention to provide a method of manufacturing a semiconductor device capable of forming a channel stop region and a threshold voltage control region by a single ion implantation process.

It is another object of the present invention to provide a method of manufacturing a semiconductor device capable of lowering a parasitic capacitance of a MOSFET.

An anti-oxidation film is formed on the element forming region of a semiconductor substrate, and a thick oxide film for isolating elements is formed in regions exposed outside the anti-oxidation film.

Next, without removing the anti-oxidation film, impurities are implanted at an acceleration energy allowing the impurities to pass through the anti-oxidation film and oxide film. By properly setting the film thicknesses of the element isolating (field) oxide film and anti-oxidation film and the impurity implantation energy, impurity concentration distributions suitable for the regions under the field oxide film and the element forming region can be formed.

Ion implantation for forming a channel stop region is performed under the condition that the element forming region is covered with the anti-oxidation film. Therefore, the energy of ions implanted into the element forming region through the anti-oxidation film reduces so that impurity ions are implanted into the shallow region.

By properly selecting the thickness of the element isolating field oxide film, the material and thickness of the anti-oxidation film, and the acceleration energy of ion implantation, it becomes possible to form the channel stop region and threshold voltage control region by a single ion implantation process.

Impurity ions are not implanted to a deep position at the element forming region so that a parasitic capacitance of the source/drain regions can be suppressed low.

It is possible to form both the channel stop region under the field oxide film and the threshold voltage control region at the channel region by a single ion implantation process.

DETAILED DESCRIPTION OF THE PREFERRED EMBODIMENTS

FIGS. 1A to 1I schematically illustrate a method of manufacturing a CMOS semiconductor integration circuit according to an embodiment of the invention.

Figure 1A:
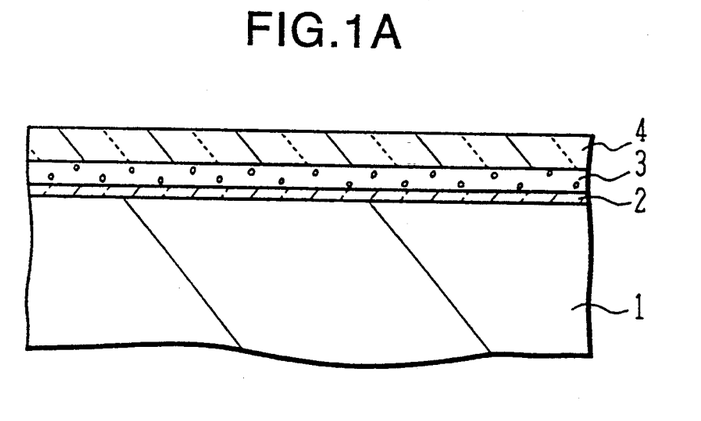
FIGS. 1A to 1I are cross sectional views of a semiconductor substrate illustrating a method of manufacturing a semiconductor device according to an embodiment of the invention.

As shown in FIG. 1A, a p-type silicon wafer having a resistivity of 10 $\Omega$cm is prepared. This silicon wafer is thermally oxidized in an oxidizing atmosphere at a temperature of 850° C. to form a thermal oxide film 2 on the wafer surface to a thickness of 3 nm.

Next, a polycrystalline silicon film 3 is deposited on the thermal oxide film 2 to a thickness of about 50 nm by CVD. In this specification, the term "polycrystalline silicon" is intended to include also amorphous silicon. Substantially similar functions and effects can be obtained by using amorphous silicon instead of polycrystalline silicon.

Next, an $Si_3N_4$ film 4 is formed on the polycrystalline silicon film 3 to a thickness of about 150 nm by CVD.

Figure 1B:
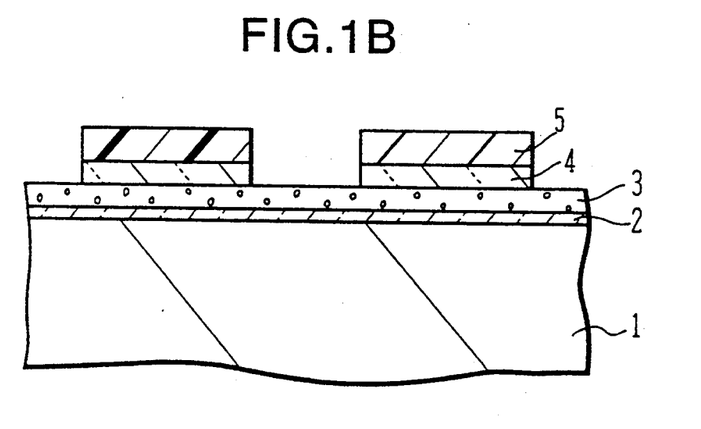

As shown in FIG. 1B, a photo-resist film is spin-coated on the $Si_3N_4$ film, selectively exposed with ultraviolet lights and developed in a developer agent to form a resist pattern 5 covering an element forming region.

By using this resist pattern 5 as an etching mask, the $Si_3N_4$ film is etched, for example in hot phosphoric acid. Next, the resist pattern 5 is removed by dilute HF solution. The $Si_3N_4$ film pattern formed in the above manner functions as an anti-oxidation film which prevents or retards passage of oxygen atoms or of molecules containing oxygen.

Figure 1C:
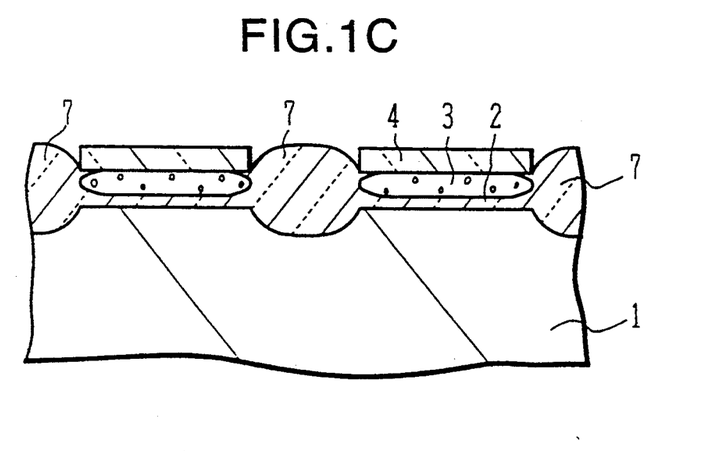

As shown in FIG. 1C, the silicon wafer is exposed in a wet oxidizing atmosphere ($O_2+H_2O$) at a temperature of 900° C. to oxidize the polycrystalline silicon film 3 by wet oxidation and the surface of the silicon wafer 1, to thereby form an $SiO_2$ film (field oxide film) 7 having a thickness of about 200 nm on the silicon surface not covered with the $Si_3N_4$ film. Polycrystalline silicon is likely to be oxidized more rapidly than single crystal silicon. Therefore, a thick oxide film with a small bird's beak can be formed easily.

Figure 1D:
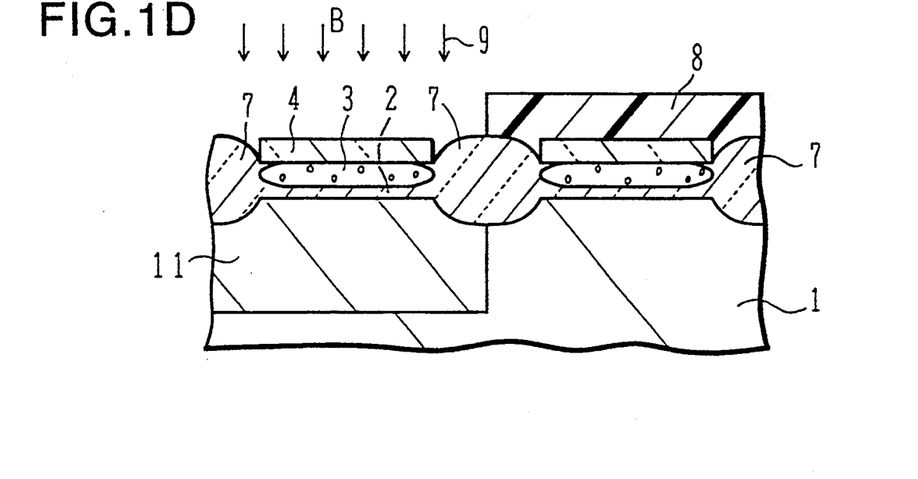

Next, as shown in FIG. 1D, a resist film is coated on the silicon waver surface, exposed and developed to form a resist pattern 8 having an opening at the area corresponding to only a p-type well forming region. This resist pattern has a thickness of, for example, 2.5 $\mu$m.

By using this resist pattern as an ion implantation mask, boron ions 9 are implanted at an acceleration energy of 450 keV and at a dose of $4\times 10^{13}$ cm$^{-2}$. This boron implantation at a high acceleration energy forms a p-type well 11 reaching a deep position in the silicon wafer.

Figure 1E:
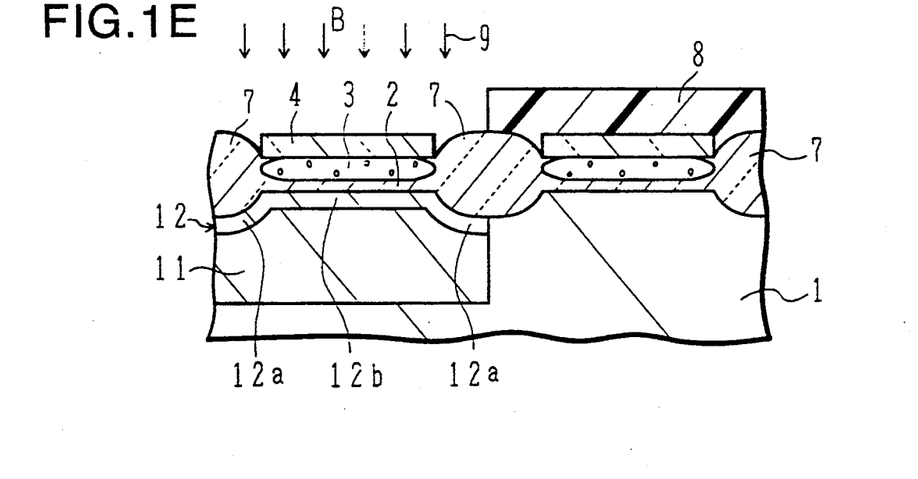

Next, as shown in FIG. 1E, by using the same resist pattern as an ion implantation mask, boron ions 9 are implanted at an acceleration energy of 40 keV and at a dose of $4\times 10^{13}$ cm$^{-2}$. This ion implantation forms a channel stop region 12a having an increased p-type impurity concentration in the p-type well 11 under the field oxide film 7 and a threshold voltage control region 12b at the element forming region, respectively, as a single ion implanted region 12.

Since the element forming region is covered with the $Si_3N_4$ film 4, boron at the acceleration energy of 40 keV is implanted at the shallow position.

Figure 2:
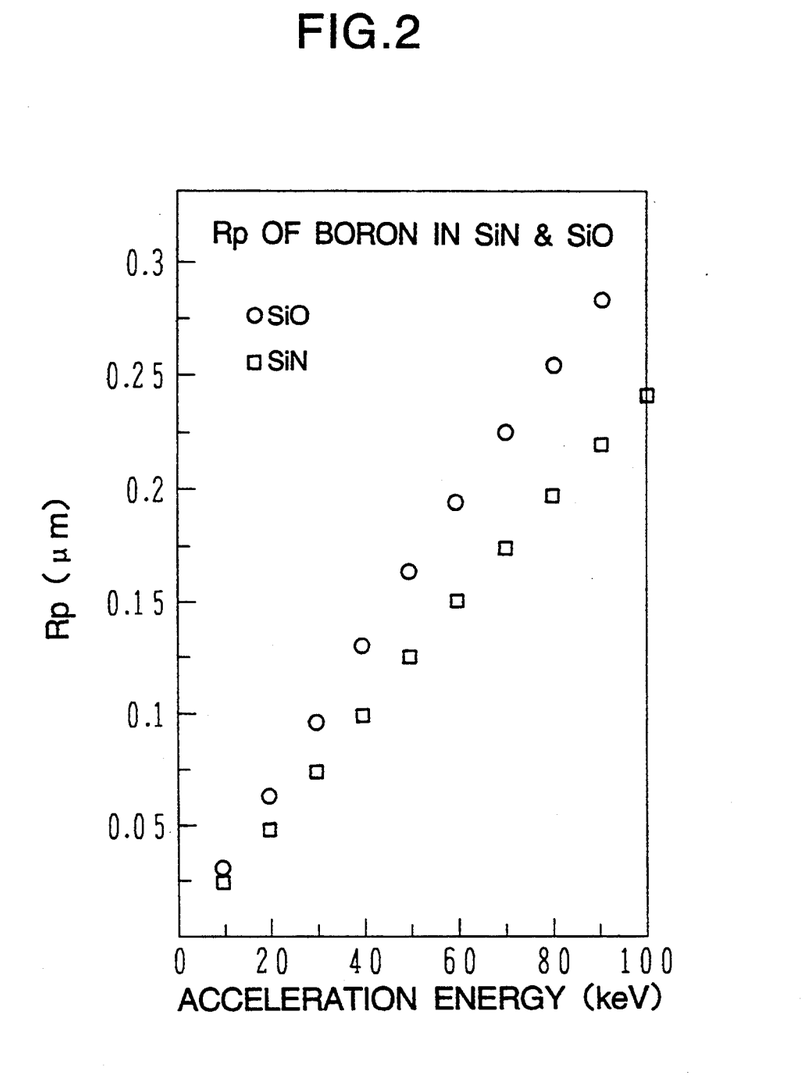
FIG. 2 is a graph showing the ranges of boron ions in an oxide film and in a nitride film.

FIG. 2 is a graph showing the ranges of boron ions passing through an oxide film and an nitride film, as a function of an acceleration energy. As seen from the graph, the silicon nitride film has a higher interception ability of boron ions than the silicon oxide film.

An implantation depth of boron ions at the acceleration energy of 40 keV in the silicon nitride film is about 0.10 μm, and that in the silicon oxide film is about 0.13 μm.

The amount of boron ions passed through the field oxide film 7 having a thickness of 200 nm is therefore generally equal to the amount of boron ions passed through the Si3N4 film having a thickness of 150 nm.

Since the polycrystalline silicon film 3 having a thickness of 50 nm is formed under the Si3N4 film 4, the distribution of implanted boron ions reduces also in the polycrystalline film 3, has a lower boron concentration at the surface of the threshold voltage control region 12b than at the channel stop region 12a, and rapidly lowers as the depth increases. In other words, the channel stop region 12a has a higher surface impurity concentration than that of the channel region 12b.

In the above manner, it is possible to form both the channel stop region 12a having a sufficient boron concentration and the threshold voltage control region 12b having desired boron concentrations by a single ion implantation. Ion implantation into the p-type well is completed in the above manner. Thereafter, the resist mask 8 is removed.

Figure 1F:
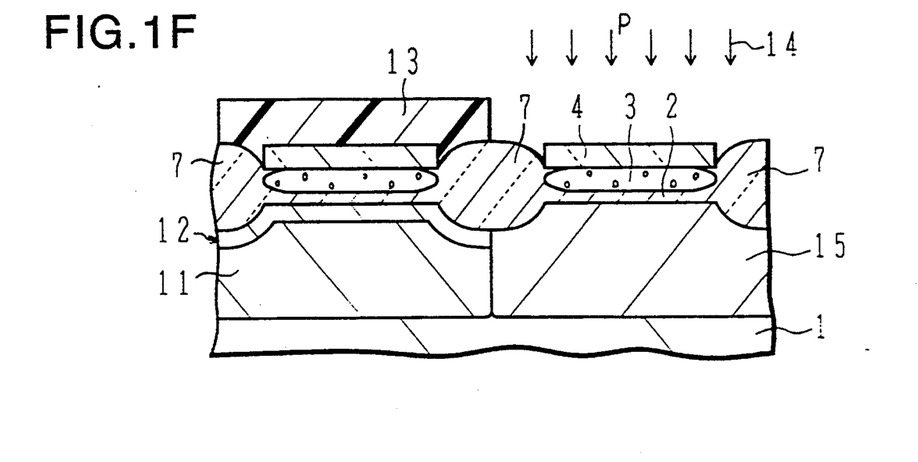

Next, as shown in FIG. 1F, a resist film is coated over the silicon wafer, exposed and developed to form a resist pattern 13 having an opening at the area corresponding to only an n-type well forming region.

By using this resist pattern 13 as an ion implantation mask, phosphorous (P) ions are implanted at an acceleration energy of 800 keV and at a dose of $4 \times 10^{13}$ cm$^{-2}$ to form an n-type well 15 to generally the same depth as the p-type well 11. The p-type and the n-type wells 11 and 12 may be adjacent to each other, as shown in the figure.

Figure 1G:
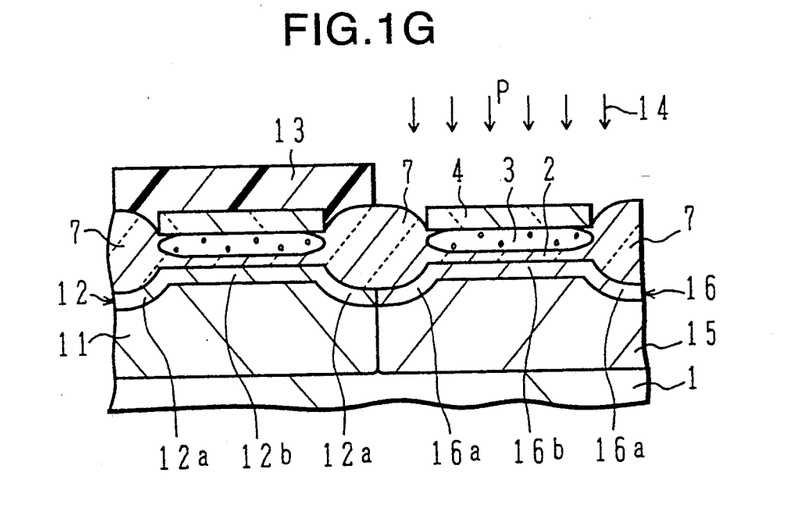

Next, as shown in FIG. 1G, by using the same resist pattern 13 as an ion implantation mask, phosphorous (P) ions are implanted at an acceleration energy of 100 keV and at a dose of $7 \times 10^{13}$ cm$^{-2}$. This ion implantation forms a channel stop region 16a under the field oxide film 7 and a threshold voltage control region 16b at the element forming region, respectively, as a single ion implanted region 16.

Figure 1H:
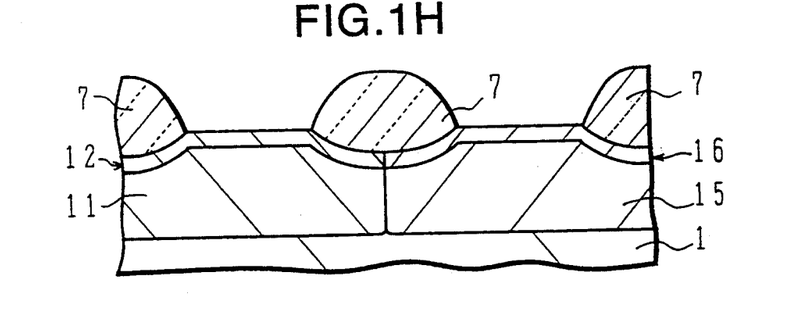

Thereafter, the resist pattern 13, Si3N4 film 4, and polycrystalline silicon film 3 are removed, realizing the structure shown in FIG. 1H.

The thick oxide film 7 for isolating elements is being formed on the surface of the silicon wafer 1, and the deep p- and n-type wells 11 and 15 are being formed surrounded by the thick oxide film 7. The channel stop regions 12a and 16a and threshold voltage control regions 12b and 16b are being formed under the field oxide film 7 and in the surface region of the element forming regions. An NMOS transistor is formed in the p-type well 11 and a PMOS transistor is formed in the n-type well 15 to form a CMOS integration circuit.

Figure 1I:
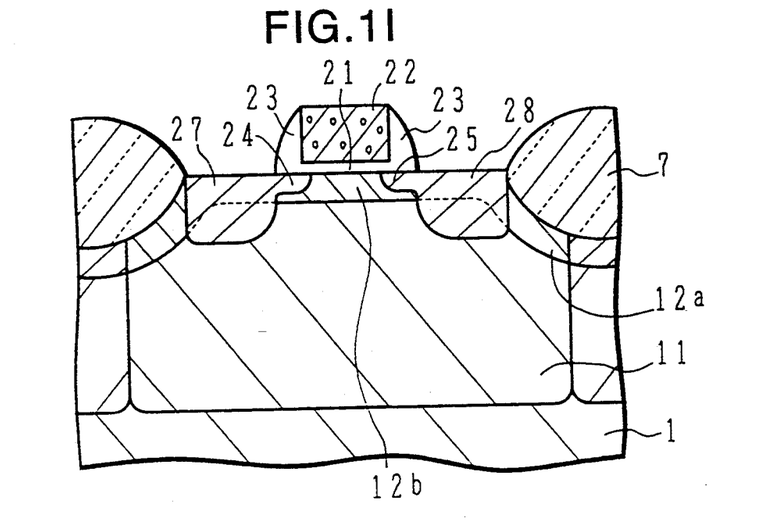

FIG. 1I shows an example of the structure of a MOSFET manufactured by the above-described processes. A polycrystalline silicon gate electrode 22 is being formed on the surface of the p-type well 11, with an thin gate oxide film 21 being interposed therebetween.

The side walls of the polycrystalline silicon gate 22 are being covered with side wall oxide regions 23. Source/drain regions 24 and 25 of a low n-type impurity concentration having an LDD structure are being formed under the side wall oxide regions 23.

Source/drain regions 27 and 28 of a high impurity concentration are being formed at the outside of the side wall oxide regions 23. The bottoms of the source/drain regions 27 and 28 extend lower than the threshold voltage control region 12b and reach the well region having a low impurity concentration. As a result, parasitic capacitance of the source/drains regions 27 and 28 is small.

In the example shown in FIG. 1I, the structure of an NMOS transistor formed in the p-type well 11 is shown. A PMOS transistor is formed in the n-type well 15 with the same structure. The conductivity type in the n-type well 15 is opposite to that in the p-type well 11.

Figure 3A:
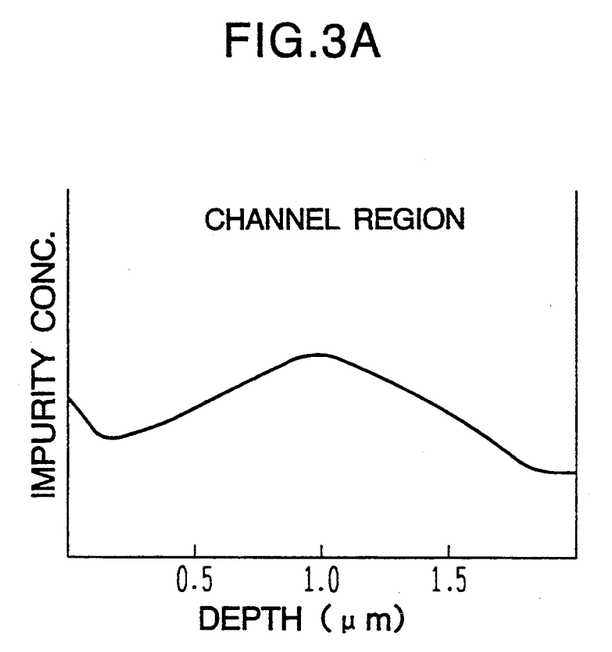
FIGS. 3A and 3B are graphs showing impurity concentration distributions in the semiconductor device of the embodiment shown in FIGS. 1A to 1I.
Figure 3B:
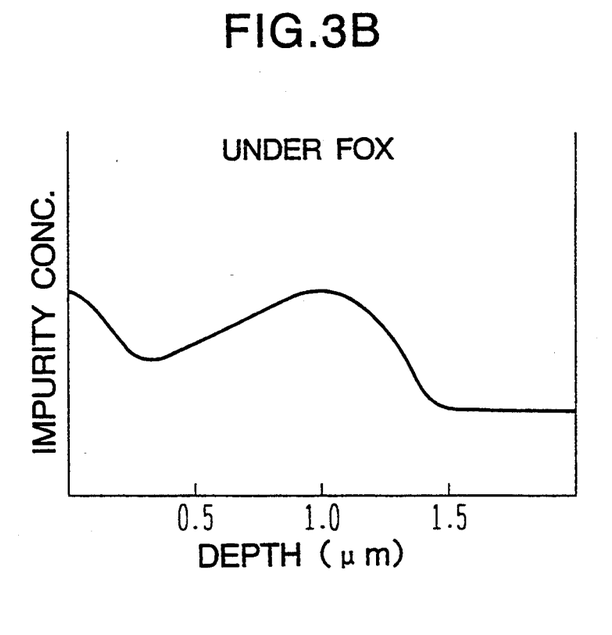

FIGS. 3A and 3B are graphs showing impurity concentration distributions in the p-type well of the embodiment shown in FIGS. 1A to 1I. FIG. 3A is a graph showing an impurity concentration distribution at the channel region as a function of depth, and FIG. 3B is a graph showing an impurity concentration distribution under the field oxide film. The abscissa represents a depth in a linear scale, and the ordinate represents an impurity concentration in a logarithmic scale.

At the channel region, although the impurity concentration at the surface thereof is somewhat high, it quickly lowers as the depth increases. It then gradually rises as the depth further increases. If the bottoms of the source/drain regions are set at the valley of the impurity concentration distribution, parasitic capacitance of the source/drain regions becomes small.

The deeper regions than the source/drain regions constitute a retrograde well where an impurity concentration gradually rises. As a result, a transistor with a high resistance to latch-up can be formed.

At the region under the field oxide film, the impurity concentration at the interface with the field oxide film is set sufficiently high, effectively preventing the formation of an inverted channel.

In the above embodiment, a polycrystalline silicon layer is formed on the surface of a silicon wafer, and an Si3N4 film as an anti-oxidation film is formed on the polycrystalline silicon layer. A polycrystalline silicon film has a higher oxidation speed than a single crystal silicon so that it is easy to form a thick oxide film while suppressing a bird's beak. The polycrystalline silicon film in this embodiment is not always required to be used.

FIGS. 4A to 4D are cross sectional views of another semiconductor substrate illustrating a simplified embodiment.

Figure 4A:
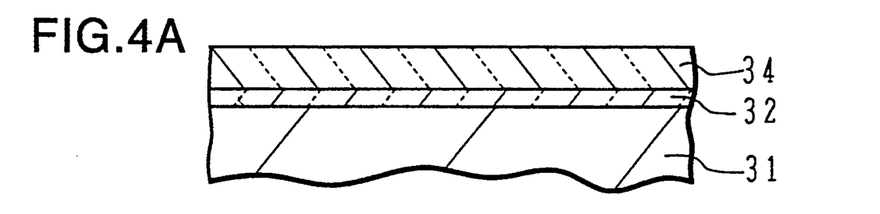
FIGS. 4A to 4D are cross sectional views of a semiconductor substrate illustrating a method of manufacturing a semiconductor device according to another embodiment of the invention.

As shown in FIG. 4A, a thermal oxide film 32 is formed on the surface of an n-type silicon wafer 31, and an Si3N4 film 34 is deposited on the thermal oxide film 32.

Figure 4B:
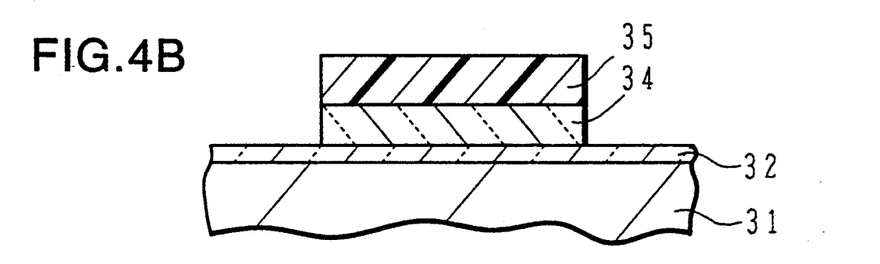

As shown in FIG. 4B, a photoresist film is coated on the Si3N4 film 34, exposed and developed to form a resist pattern 35 covering an element forming region. By using this resist pattern 35 as an etching mask, the underlying Si3N4 film 34 is etched. Thereafter, the resist pattern 35 is removed.

Figure 4C:
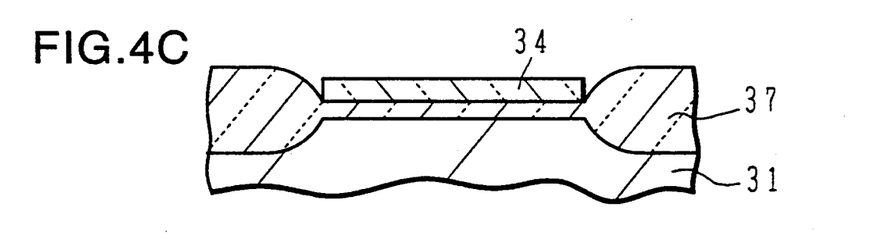

Next, as shown in FIG. 4C, by using the Si3N4 film 34 as an oxidation mask, the surface of the silicon wafer 31 is thermally oxidized to a desired thickness to form a field oxide film 37.

Figure 4D:
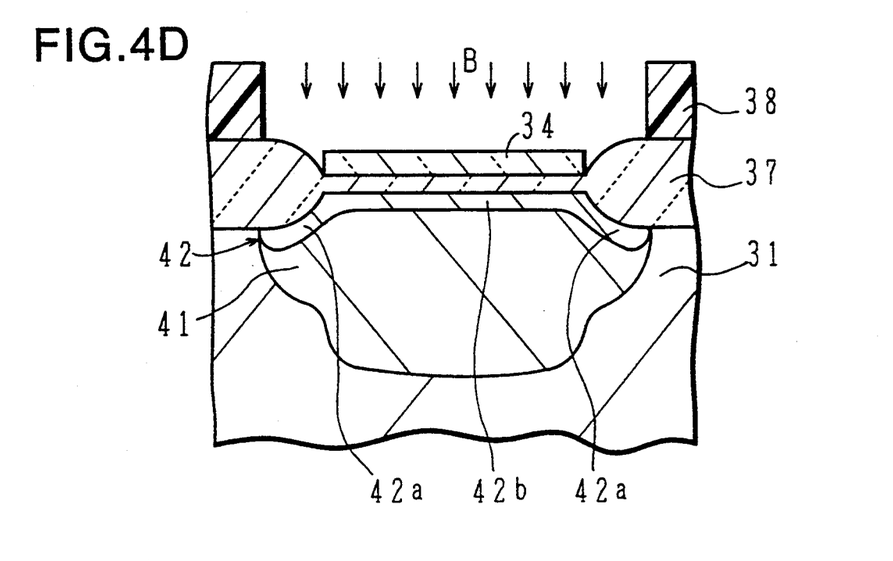

Thereafter, as shown in FIG. 4D, a resist pattern 38 having an opening at the area corresponding to a p-type well region is formed and ions are implanted.

In order to form a p-type well region 41, boron ions are implanted at a high acceleration energy and then at a relatively low acceleration energy to thereby form a single ion implanted region 42 constituting both a channel stop region 42a and a threshold voltage control region 42b.

By properly controlling the thicknesses of the $Si_3N_4$ film 34 and field oxide film 37 and the acceleration energy of ion implantation, it is possible to form both the channel stop region 42a and threshold voltage control region 42b having desired impurity concentrations at the same time by a single ion implantation.

In the above embodiments, an anti-oxidation mask over the element forming region is a laminated layer of a polycrystalline silicon film and a nitride film, or only a nitride film. The anti-oxidation mask may have a different structure provided that it serves as a mask against oxidation reaction.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of manufacturing a semiconductor device comprising the steps of:
   forming an anti-oxidation film pattern over an element forming region of a semiconductor substrate;
   selectively oxidizing a region not covered with said anti-oxidation film pattern on said semiconductor substrate to form an isolation oxide film; and
   implanting first impurity ions into said semiconductor substrate via said isolation oxide film and said anti-oxidation film at a first acceleration energy to form a threshold voltage control region under said anti-oxidation film and a channel stop region under said isolation oxide film.

2. A method according to claim 1, wherein an impurity concentration at the surface of said channel stop region is higher than an impurity concentration at the surface of said threshold voltage control region.

3. A method according to claim 1, wherein said semiconductor substrate has a surface layer formed of a polycrystalline semiconductor layer, said anti-oxidation film pattern is formed on said polycrystalline semiconductor layer, and said isolation oxide film forming step oxidizes said polycrystalline layer not covered with said anti-oxidation film pattern.

4. A method according to claim 1, further comprising, before said step of implanting ions to form said threshold voltage control region and said channel stop region, the step of implanting second impurity ions of the same conductivity type as said impurities into the semiconductor substrate via said isolation oxide film and said anti-oxidation film at a higher acceleration energy than said first acceleration energy to form a well.

5. A method according to claim 4, wherein said well has a graded impurity concentration distribution lowering with decrease in depth from a depth position toward said threshold voltage controlling region.

6. A method according to claim 2, wherein said semiconductor substrate has a surface layer formed of a polycrystalline semiconductor layer, said anti-oxidation film pattern is formed on said polycrystalline semiconductor layer, and said isolation oxide film forming step oxidizes said polycrystalline layer not covered with said anti-oxidation film pattern.

7. A method according to claim 4, wherein said semiconductor substrate has a surface layer formed of a polycrystalline semiconductor layer, said anti-oxidation film pattern is formed on said polycrystalline semiconductor layer, and said isolation oxide film forming step oxidizes said polycrystalline layer not covered with said anti-oxidation film pattern.

8. A method according to claim 7, wherein said well has a graded impurity concentration distribution lowering with decrease in depth from a depth position toward said threshold voltage controlling region.

9. A method according to claim 1, wherein said semiconductor substrate has a surface layer formed of an oxide film, and said anti-oxidation film pattern is formed on said oxide film.

10. A method according to claim 1, wherein said semiconductor substrate has a surface laminate formed of an oxide film and a polycrystalline semiconductor layer, and said anti-oxidation film pattern is formed on said surface laminate.

11. A method according to claim 1, wherein said impurity ions in said impurity ion implanting step have a second conductivity type, further comprising, after said isolation oxide film forming step, the steps of:
   forming a first resist mask having an opening defining a second conductivity type well region, and
   by using said first resist mask, implanting second conductivity type ions in said semiconductor substrate via said anti-oxidation film pattern and said isolation oxide film to form a second conductivity type well.

12. A method according to claim 1, wherein said impurity ions in said impurity ion implanting step have a second conductivity type, further comprising, after said isolation oxide film forming step, the steps of:
   forming a first resist mask having an opening defining a region for forming a first conductivity type transistor, the first conductivity type being opposite to said second conductivity type; and
   by using said first resist mask, implanting second conductivity type ions at a high acceleration energy to form a second conductivity type well in said first conductivity type transistor forming region,
   wherein by using said first resist mask as a mask, said step of implanting ions to form said threshold voltage control region and said channel stop region implants ions of said second conductivity type in said semiconductor substrate at a relatively low acceleration energy.

13. A method according to claim 12, further comprising the steps of:
   removing said first resist mask;
   forming a second resist mask having an opening defining a region for forming a second conductivity type transistor; and
   by using said second resist mask as a mask, implanting ions of first conductivity type into said semiconductor substrate at a high acceleration energy to form a first conductivity type well in said second conductivity type transistor forming region.

14. A method according to claim 13, further comprising the step of, by using said same second resist mask as a mask, implanting ions of said first conductivity type into said second conductivity type transistor forming region via said isolation oxide film and said anti-oxidation film at a relatively low acceleration energy to form a threshold voltage control region under said anti-oxidation film and a channel stop region under said isolation oxide film.

* * * * *